（12) United States Patent
Miyase et al.

(10) Patent No.: US 8,589,751 B2
(45) Date of Patent: Nov. 19, 2013

(54) DON'T-CARE-BIT IDENTIFICATION METHOD AND DON'T-CARE-BIT IDENTIFICATION PROGRAM

(75) Inventors: Kohei Miyase, Fukuoka (JP); Xiaoqing Wen, Fukuoka (JP); Seiji Kajihara, Fukuoka (JP)

(73) Assignee: Lptex Corporation, Tokyo (JP)

( * ) Notice: Subject to any disclaimer, the term of this patent is extended or adjusted under 35 U.S.C. 154(b) by 633 days.

(21) Appl. No.: 12/761,643

(22) Filed: Apr. 16, 2010

(65) Prior Publication Data

US 2010/0218063 A1    Aug. 26, 2010

Related U.S. Application Data

(63) Continuation-in-part of application No. PCT/JP2008/068775, filed on Oct. 16, 2008.

(30) Foreign Application Priority Data

Oct. 19, 2007    (JP) ................................. 2007-272496

(51) Int. Cl.
*G01R 31/28*    (2006.01)

(52) U.S. Cl.
USPC ............................ 714/738; 714/724; 714/726

(58) Field of Classification Search
USPC .................. 714/724, 726, 738, 729, 741, 30; 716/136, 52
See application file for complete search history.

(56) References Cited

U.S. PATENT DOCUMENTS

| | | | | |
|---|---|---|---|---|
| 5,726,996 | A * | 3/1998 | Chakradhar et al. | 714/724 |
| 6,018,813 | A * | 1/2000 | Chakradhar et al. | 714/724 |
| 6,223,314 | B1 * | 4/2001 | Arabi et al. | 714/726 |
| 6,301,685 | B1 * | 10/2001 | Shigeta | 714/799 |
| 7,962,822 | B2 * | 6/2011 | Wen et al. | 714/738 |
| 7,971,118 | B2 * | 6/2011 | Wen et al. | 714/738 |
| 8,037,387 | B2 * | 10/2011 | Kajihara et al. | 714/738 |
| 2009/0083593 | A1 * | 3/2009 | Wen et al. | 714/726 |
| 2009/0259898 | A1 * | 10/2009 | Wen et al. | 714/726 |

OTHER PUBLICATIONS

International Search Report for PCT/JP08/068775 mailed Dec. 16, 2008.
Sankaralingam, et al., "Reducing Power Dissipation During Test Using Scan Chain Disable", Proc. VLSI Test Symp., 2001, pp. 319-324, 6 pages.
Abramovici, et al., Digital Systems Testing and Testable Design, Computer Science Press, 1990, see pp. 97-98, 183-184, 14 pages.

* cited by examiner

*Primary Examiner* — Phung M Chung
(74) *Attorney, Agent, or Firm* — Rankin, Hill & Clark LLP

(57)    ABSTRACT

The provided are a don't-care-bit identification method and program for identifying don't-care-bits from the first and the second input vectors in an input-vector pair while keeping the sensitization status of paths, in a combinational circuit, sensitized by applying the first and the second input vectors in serial to input lines of combinational circuit. The method identifies an unspecified bit from the first and the second input vectors $V_1$ and $V_2$ composed of logic values 0 and 1, which are applied to the combinational portion in a sequential circuit or to an independent combinational circuit. The method includes an identification step for identifying an unspecified bit from the first and the second input vectors, while keeping sensitization status of a part of or all of the paths, sensitized by applying the first and the second input vectors.

6 Claims, 6 Drawing Sheets

(A)

(B)

US 8,589,751 B2

DON'T-CARE-BIT IDENTIFICATION METHOD AND DON'T-CARE-BIT IDENTIFICATION PROGRAM

CROSS-REFERENCE TO RELATED APPLICATIONS

This application is a Continuation-in-Part of International Application No. PCT/JP2008/068775 filed Oct. 16, 2008, the entire contents of which is hereby incorporated by reference.

This application is based upon and claims the benefit of priority from prior Japanese Patent Application No. 2007-272496 filed Oct. 19, 2007, the entire contents of which is hereby incorporated by reference.

TECHNICAL FIELD

The present invention relates to a don't-care-bit identification method and a don't-care-bit identification program for identifying don't-care-bits from first and second input vectors in an input-vector pair, which are composed of logic values 0 (zero) and 1 (one), and which are applied in serial to input line of independent combinational circuit or of combinational portion of scan-designed sequential circuit.

BACKGROUND ART

Semiconductor large scale integrated circuits (simply, LSI in the following) are shipped after the phases of design, manufacturing and test. Here, test means the operation of determining whether products are defective or defect free by applying test vectors (simply, vectors in the following) to LSI (concretely, combinational portion in a sequential circuit) manufactured based on design data and by comparing the response with expected value. The rate of defect free LSI products which pass the test (yield) is said to be the key of semiconductor industry because the quality, reliability and cost of LSI depends on it greatly. And at-speed testing conducts tests of LSI at the operating speed of actual use. When vectors are composed of initialization pattern and of launch pattern which detect faults, as shown in FIG. 5, at-speed testing is conducted as follows. The initialization pattern is applied to combinational circuit at the rising timing of shift pulse $S_L$. Subsequently, the launch pattern is applied to the combinational circuit at the rising timing of pulse $C_1$. And the resulted response of the combinational circuit is observed at the rising timing of pulse $C_2$. The testing state of the combinational circuit is finished at the rising timing of shift pulse $S_1$.

High launch-induced switching activity in a combinational circuit caused by applying the launch pattern after pulse $C_1$ results in frequent decrease of power supply voltage (IR-drop) and increase of power supply noise, increasing the delay in the combinational circuit. If the delay increases too much, the adequate response which should be obtained at the timing of pulse $C_2$ cannot be obtained, resulting in capturing wrong response to flip-flops in the sequential circuit by timing error. Consequently, test malfunction occurs where a product is wrongly determined as defective because the response from the combinational circuit doesn't match the expected value. And test malfunctions occur frequently in at-speed testing where the timing gap between capture $C_1$ and capture $C_2$ is narrow.

There is a method for generating a vector which doesn't cause IR-drop, called X-filling technique. When detecting one or a plurality of kinds of faults to be detected in an LSI (concretely, combinational portion in a sequential circuit), it is possible to detect the faults by assigning logic values 0 or 1 only to a part of bits which relates to detecting the faults in the vector. The rest of the bits which don't relate to detecting the faults (that is, which don't decrease fault coverage) in the vector are don't-care-bits (X-bits). X-filling technique is a technique to assign logic values 0 or 1 to the don't-care-bits for a particular purpose. For example, when the response $F_p(V)$ and $F_s(V)$ are obtained for a vector V which is composed of $V_p$ and $V_s$, as shown in FIG. 6, the difference can be decreased between $V_s$ and $F_s(V)$. Here, in the FIG. 6, $p_i$ (i=1 to 6) and $q_i$ (i=1 to 6) denotes input lines and output lines of the combinational circuit, respectively 10. In Non-Patent Document 1, don't-care-bit identification for every test input by use of a method for checking in order whether each of the bits can be a don't-care-bit is described.

Non-Patent Document 1: R. Sankaralingam, R. Oruganti, and N. Touba, "Reducing Power Dissipation during Test Using Scan Chain Disable", Proc. VLSI Test Symp., pp. 319-324, 2001.

DISCLOSURE OF THE INVENTION

Problems to be Solved by the Invention

However, with the method in the Non-Patent Document 1, there is a problem that don't-care-bits effective for avoiding test malfunctions are not obtained frequently, because the correlations among vectors are totally ignored. Besides, on identifying don't-care-bits, there is a problem that only fault detection by vector is guaranteed and that the detection of small-delay-defect (timing-related fault) which is put much on recently, is not guaranteed. Additionally, on assigning logic values to don't-care-bits, only don't-care-bits in pseudo primary input (output from flip flops) are paid attention to and don't-care-bits in pseudo primary output (input to flip flops) are totally ignored. As a result, there is also a problem that the best effect of avoiding test malfunctions cannot be obtained.

It is, therefore, an object of the present invention to provide a don't-care-bit identification method and a don't-care-bit identification program which enable to identify don't-care-bits from each of first and second input vectors in an input-vector pair, which are applied in serial to input line of combinational circuit, guaranteeing the path, in the combinational circuit, sensitized by the first and the second input vectors in an input-vector pair.

Means for Solving the Problems

For solving the problems, a first aspect in accordance with the present invention provides a don't-care-bit identification method for identifying don't-care-bits from the first and the second input vectors in an input-vector pair, which are composed of logic values 0 and 1, and which are applied in serial to the input lines of a combinational circuit or the combinational portion of a scan-designed sequential circuit, comprising:

an identification step of identifying the don't-care-bits from the first and the second input vectors while keeping the sensitization status of a part of or all of sensitized paths, which are sensitized by applying the first and the second input vectors to the combinational circuit or the combinational portion.

Concerning the don't-care-bit identification method in accordance with the present invention, it is preferred that the identification step comprises:

the first step of specifying the second input lines, in the combinational circuit or the combinational portion corresponding to the second input vector, which can be reached by tracing back from the end-point output lines of a part of or all of the sensitized paths toward the input side based on the circuit information of the combinational circuit or the combinational portion;

the second step of specifying the first input lines, in the combinational circuit or the combinational portion corresponding to the first input vector, which can be reached by tracing back from the end-point output lines of a part of or all of the sensitized paths or from the second input lines toward the input side based on the circuit information of the combinational circuit or the combinational portion;

the third step of identifying the logic bits, in the first and the second input vectors, corresponding to the first input lines or the second input lines, respectively, as the first and the second essential bits, respectively; and the fourth step of identifying the bits in the first and the second input vectors other than the first and the second essential bits, respectively, as the don't-care-bits.

A second aspect in accordance with the present invention provides a don't-care-bit identification program for identifying don't-care-bits from the first and the second input vectors in an input-vector pair, which are composed of logic values 0 and 1, and which are applied in serial to the input lines of a combinational circuit or the combinational portion of a scan-designed sequential circuit, comprising:

an identification procedure of identifying the don't-care-bits from the first and the second input vectors while keeping the sensitization status of a part of or all of sensitized paths, which are sensitized by applying the first and the second input vectors to the combinational circuit or the combinational portion.

Concerning the don't-care-bit identification program in accordance with the present invention, it is preferred that the identification procedure comprises:

the first procedure of specifying the second input lines, in the combinational circuit or the combinational portion corresponding to the second input vector, which can be reached by tracing back from the end-point output lines of a part of or all of the sensitized paths toward the input side based on the circuit information of the combinational circuit or the combinational portion;

the second procedure of specifying the first input lines, in the combinational circuit or the combinational portion corresponding to the first input vector, which can be reached by tracing back from the end-point output lines of a part of or all of the sensitized paths or from the second input lines toward the input side based on the circuit information of the combinational circuit or the combinational portion;

the third procedure of identifying the logic bits, in the first and the second input vectors, corresponding to the first input lines or the second input lines, respectively, as the first and the second essential bits, respectively; and the fourth procedure of identifying the bits in the first and the second input vectors other than the first and the second essential bits, respectively, as the don't-care-bits.

Effect of the Invention

According to the don't-care-bit identification method and the don't-care-bit identification program in accordance with present invention, the detecting capability of testing of the first and the second input vectors in an input-vector pair, which are applied in serial to input line of combinational circuit, are enabled to be preserved because the don't-care-bits are identified from the first and the second input vectors in an input-vector pair, respectively, guaranteeing the path, in the combinational circuit, sensitized by the first and the second input vectors in an input-vector pair.

Especially, according to the don't-care-bit identification method and the don't-care-bit identification program in accordance with present invention, it is enabled to identify the don't-care-bits while keeping the sensitization status of the path, when the first and the second essential bits are identified by tracing back in the combinational circuit from the end-point output line of the path, established by applying the first and the second input vectors in an input-vector pair, respectively, toward input side based on circuit information of the combinational circuit and, subsequently, when identifying the bits in the first and the second input vectors in an input-vector pair other than the first and the second essential bits, respectively, as the don't-care-bits.

DESCRIPTION OF REFERENCE SYMBOLS 10 combinational circuit
11 sequential circuit
12 flip-flops

PREFERRED EMBODIMENT OF THE INVENTION

In what follows, referring to the attached figures, a preferred embodiment of the present invention will be explained for better understanding of the present invention.

Figure 1:
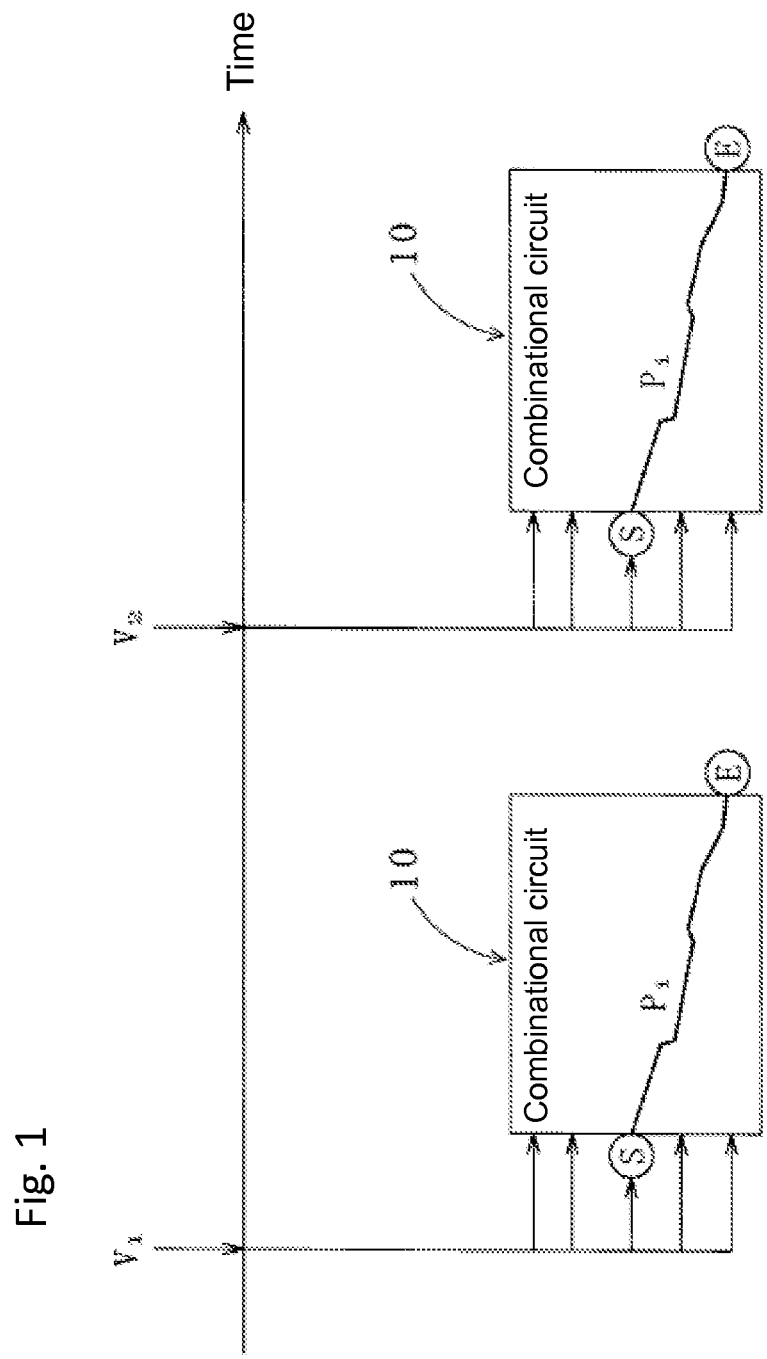
FIG. 1 shows an explanatory diagram of applying input vectors $V_1$ and $V_2$ in an input-vector pair to the combinational circuit to which the don't-care-bit identification method according to a preferred embodiment of the present invention is employed.

The don't-care-bit identification method according to the preferred embodiment of the present invention, as shown in FIG. 1, identifies don't-care-bits (logic bits which don't influence the testing of combinational circuit 10) from the first and the second input vectors $V_1$ and $V_2$ in an input-vector pair, which are composed of logic values 0 and 1, and which are applied in serial to input line of combinational circuit 10 for the purpose of the testing of combinational circuit 10. And the don't-care-bit identification method keeps the sensitization status of, for example, all of the paths $P_i$, in the combinational circuit 10, sensitized by applying the first and the second input vectors $V_1$ and $V_2$ in an input-vector pair. Concretely, at first, the first input vector $V_1$ is applied and the logic values of the path $P_i$ in the combinational circuit 10 are set. Here, path $P_i$ is the route from the start-point input line S to the end-point output line E. Next, the second input vector $V_2$ is applied and all the logic values of the path $P_i$ are sensitized. The don't-care-bit identification method includes the identification step for identifying don't-care-bits from the first and the second input vectors $V_1$ and $V_2$ in an input-vector pair, while guaranteeing that transitions occur in all the logic values of the path $P_i$ by applying the first and the second input vectors $V_1$ and $V_2$ in an input-vector pair. Here, combinational circuit 10 is the combinational portion of a scan-designed sequential circuit or an independent combinational circuit.

Figure 2:
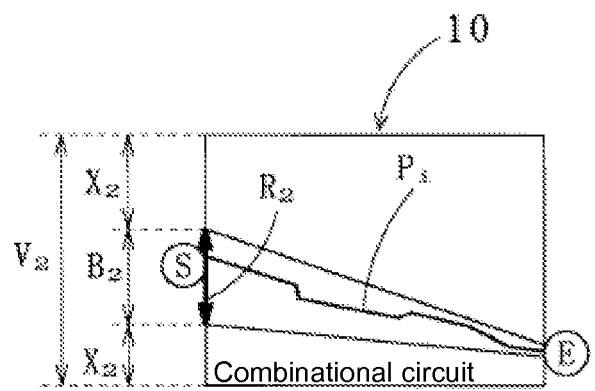
FIGS. 2 (A) and (B) shows an explanatory diagram of the same don't-care-bit identification method with that of FIG. 1.
Figure 2:
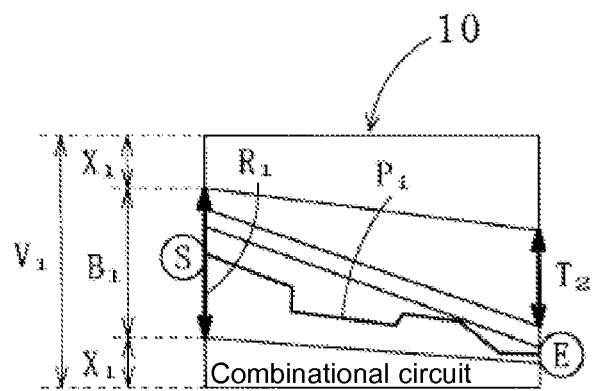

Referring to FIGS. 2 (A) and (B), the identification step includes four steps. The first step is a step of specifying, in the combinational circuit 10 to which the second input vector $V_2$ is applied, the second input lines among the input lines of the combinational circuit 10, existing in the region $R_2$. Here, $R_2$ is the region which can be reached by tracing back in the combinational circuit 10 from the end-point output line E of each of the paths $P_i$, established in the combinational circuit 10, toward input side (toward the start-point input line S side of each path $P_i$) based on circuit information of the combinational circuit 10. The second step is a step of specifying, in the combinational circuit 10 to which the first input vector $V_1$ is applied, the first input lines among the input lines of the combinational circuit 10, existing in the region $R_1$. Here, $R_1$ is the region which can be reached by tracing back in the combinational circuit 10 from the end-point output line E of each of the paths $P_i$, established in the combinational circuit 10, and from the end-point output lines $T_2$ toward input side (toward the start-point input line S side of each path $P_i$) based on circuit information of the combinational circuit 10. $T_2$ are a part of output lines of the combinational circuit 10, and each of $T_2$ provides outputs to the second input lines. The third step is a step of identifying logic bits, in the first and the second vectors $V_1$ and $V_2$, corresponding to the first input line or the second input line, respectively, as the first and the second essential bit $B_1$ and $B_2$, respectively. And the fourth step is a step of identifying the bits in the first and the second input vectors $V_1$ and $V_2$ in an input-vector pair other than the first and the second essential bits $B_1$ and $B_2$, respectively, don't-care-bits.

As shown in FIG. 2 (A), the second input lines of the combinational circuit 10, existing in the region $R_2$, which is the region that can be reached by tracing back in the combinational circuit 10 from the end-point output line E of path $P_i$, toward input side based on the circuit information of the combinational circuit 10 are identified. And the second essential bits $B_2$ are identified as the logic bits, of the second input vectors $V_2$, corresponding to the second input lines in the region $R_2$. Therefore, the second essential bit $B_2$ is the input value (bit), among the second input vector $V_2$, which affect the sensitization of path $P_i$. Then, as shown in FIG. 2 (B), the first input lines of the combinational circuit 10, existing in the region $R_1$, which is the region that can be reached by tracing back in the combinational circuit 10 from the end-point output line E of path $P_i$ and from the second input lines, toward input side based on the circuit information of the combinational circuit 10 are specified. And the first essential bits $B_1$ are identified as the logic bits, of the first input vectors $V_1$, corresponding to the first input lines in the region $R_1$. Therefore, the first essential bit $B_1$ is the input value (bit), among the first input vector $V_1$, which affect the sensitization of path $P_i$.

As described above, identifying the first and the second bits $B_1$ and $B_2$, among the first and the second vector $V_1$ and $V_2$, enables to guarantee that the same paths $P_i$ is established when the first and the second input vectors $V_1$ and $V_2$ in an input-vector pair are applied in serial to the combinational circuit 10. And if the bits in the first and the second input vectors $V_1$ and $V_2$ in an input-vector pair other than the first and the second essential bits $B_1$ and $B_2$, respectively, are identified as don't-care-bits, the path $P_i$ establishment is independent of which logic values are assigned to the don't-care-bits.

Figure 3:
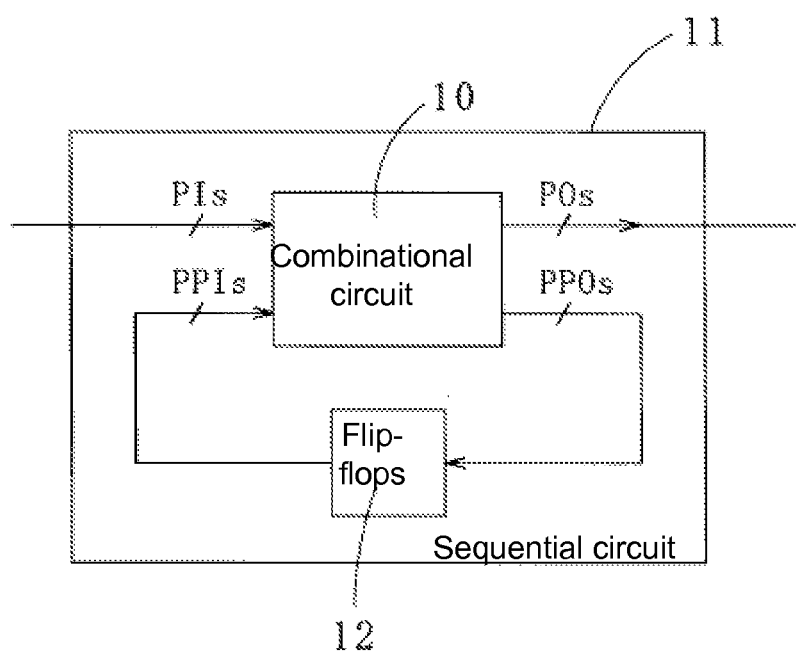
FIG. 3 shows an explanatory diagram of a scan-designed sequential circuit including the combinational circuit to which the same don't-care-bit identification method with that of FIG. 1 is employed.

Here, by assigning specific logic values to the don't-care-bits, it is possible to detect small-delay-defects of the combinational circuit 10, to cut power consumption for avoiding test malfunction from the decrease of power supply voltage (IR-drop), and to reduce test data volume. For example, it is possible to detect small-delay-defects in the path $P_i$ established in the combinational circuit 10 of a scan-designed sequential circuit 11. As shown in FIG. 3, in the combinational circuit 10, the external input lines of the combinational circuit 10 includes unique primary input lines PIs which are accessible directly from outside, and pseudo primary input lines PPIs which are output lines of flip-flops 12 in the sequential circuit 11. POs denotes primary output lines which output directly to outside, and PPOs denotes pseudo primary output lines which are input lines to flip-flops 12.

Figure 4:
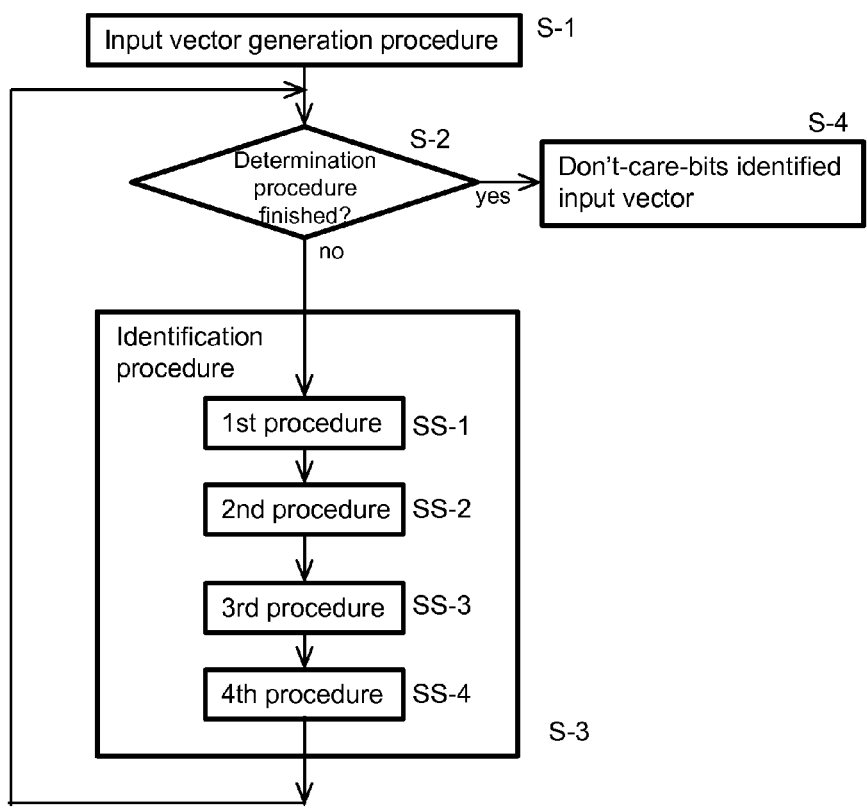
FIG. 4 shows a flowchart showing the don't-care-bit identification program according to a preferred embodiment of the present invention.
Figure 5:
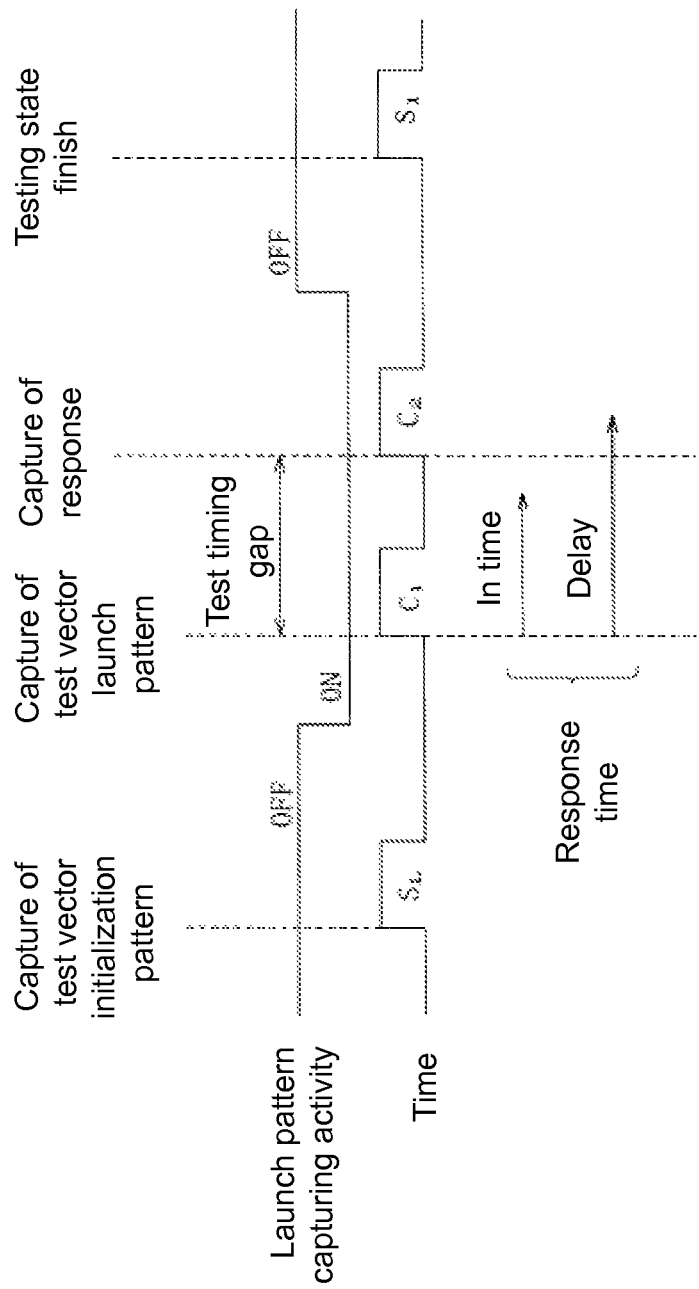
FIG. 5 shows an explanatory diagram of a reason of at-speed test malfunction of semiconductor large scale integrated circuit.
Figure 6:
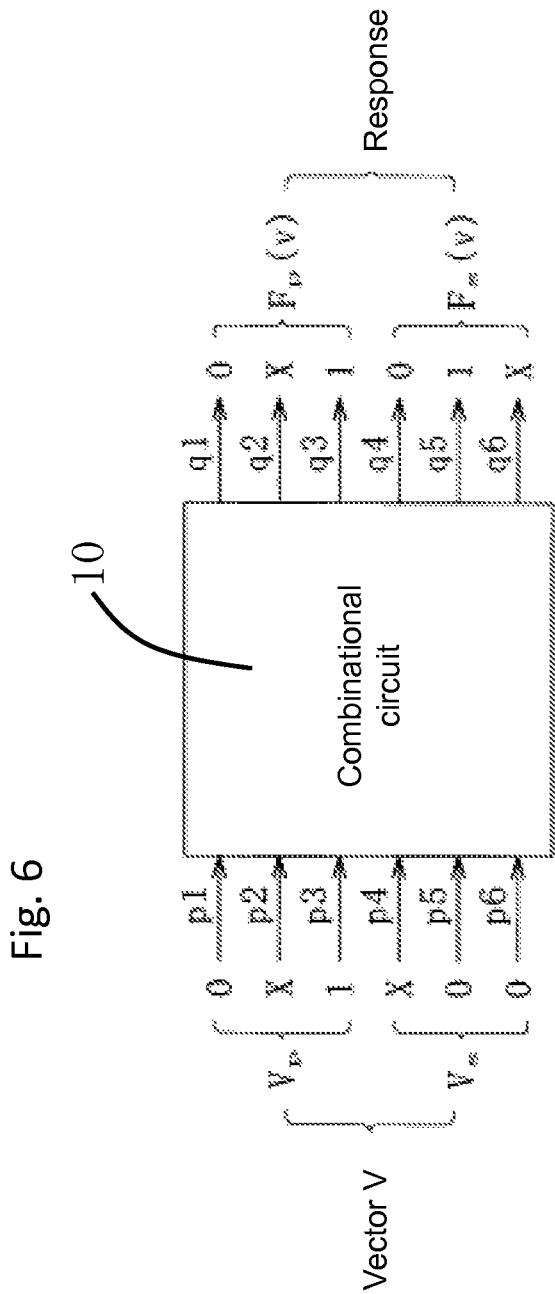
FIG. 6 shows an explanatory diagram of the relationship between test vector applied to combinational circuit and its response.

The don't-care-bit identification program according to the preferred embodiment of the present invention, as shown in FIG. 4, includes three procedures S-1, S-2, and S-3. S-1 is a input vector generation procedure for generating the first and the second input vectors $V_1$ and $V_2$ in an input-vector pair, which are applied in serial to the combinational circuit 10 for the purpose of testing the combinational circuit 10, and which establish a plurality of paths $P_i$ in the combinational circuit 10. S-2 is a determination procedure for determining whether the identification of don't-care-bits is finished or not for each of paths $P_i$ established in the combinational circuit 10. S-3 is an identification procedure for identifying the don't-care-bits from the first and the second input vectors $V_1$ and $V_2$ in an input-vector pair, respectively, while keeping the sensitization status of each of paths Pi, in the combinational circuit 10, sensitized by applying the first and the second input vectors $V_1$ and $V_2$ in an input-vector pair.

Here, the identification procedure (S-3) has four procedures. The first procedure (SS-1) is a procedure for specifying, in the combinational circuit 10 which corresponds to the applying of the second input vector $V_2$, the second input lines, which are a part of input lines of the combinational circuit 10, existing in the region $R_2$, which is the region that can be reached by tracing back in the combinational circuit 10 from the end-point output line E of each of the paths $P_i$, toward input side based on the circuit information of the combinational circuit 10. The second procedure (SS-2) is a procedure for specifying, in the combinational circuit 10 which corresponds to the applying of the first input vector $V_1$, the first input lines, which are a part of input lines of the combinational circuit 10, existing in the region $R_1$, which is the region that can be reached by tracing back in the combinational circuit 10 from the end-point output line E of each of the paths $P_i$ and from the end-point output lines $T_2$, toward input side based on the circuit information of the combinational circuit 10. Here, $T_2$ are a part of output lines of the combinational circuit 10, and each of $T_2$ provides outputs to the second input lines. The third procedure (SS-3) is a procedure for identifying the logic bits, in the first and the second input vectors $V_1$ and $V_2$ in an input-vector pair, corresponding to the first input lines or the second input lines, respectively, as the first and the second essential bits $B_1$ and $B_2$, respectively. The fourth procedure (SS-4) is a procedure for identifying the bits in the first and the second input vectors $V_1$ and $V_2$ in an input-vector pair other than the first and the second essential bits $B_1$ and $B_2$, respectively, as the don't-care-bits, respectively. Each procedure is explained below.

First, in the input vector generation procedure (S-1), by use of, for example, a conventional ATPG program (automatic test pattern generation program), the first and the second input vectors $V_1$ and $V_2$ in an input-vector pair are generated. Then, in the determination procedure (S-2), all the paths $P_i$ which are established by applying the first and the second input vectors $V_1$ and $V_2$ in an input-vector pair to the combinational circuit 10 are determined. One of the paths Pi is selected and it is determined whether, for the selected path Pi, the don't-care-bits are identified or not in the first and the second input vectors $V_1$ and $V_2$ in an input-vector pair. Mostly, in the first and the second input vectors $V_1$ and $V_2$ in an input-vector pair just generated, the don't-care-bits are not identified. Therefore, the procedure moves to the identification procedure (S-3) for identifying the don't-care-bits from the first and the second input vectors $V_1$ and $V_2$ in an input-vector pair, respectively.

At the first procedure (SS-1) in the identification procedure (S-3), when the path Pi is selected and the second input vector $V_2$ is applied, the second input lines, which are a part of input lines of the combinational circuit 10, existing in the region $R_2$, which is the region that can be reached by tracing back in the combinational circuit 10 from the end-point output line E of the path $P_i$, toward input side based on the circuit information of the combinational circuit 10, are specified. Next, in the second procedure (SS-2), when the path Pi is selected and the first input vector $V_1$ is applied, the first input lines, which are a part of input lines of the combinational circuit 10, existing in the region $R_1$, which is the region that can be reached by tracing back in the combinational circuit 10 from the end-point output line E of the path $P_i$ and from the end-point output lines $T_2$, toward input side based on the circuit information of the combinational circuit 10, are specified. Here, $T_2$ are a part of output lines of the combinational circuit 10, and each of $T_2$ provides outputs to the second input lines.

Additionally, in the third procedure (SS-3), the logic bits, in the first and the second input vectors $V_1$ and $V_2$ in an input-vector pair, corresponding to the first input lines or the second input lines, respectively, are identified as the first and the second essential bits $B_1$ and $B_2$, respectively. Identifying the first and the second essential bits $B_1$ and $B_2$, among the first and the second input vector $V_1$ and $V_2$, enables to guarantee that the same paths $P_i$ is established when the first and the second input vectors $V_1$ and $V_2$ in an input-vector pair are applied, respectively, to the combinational circuit 10. Next, in the fourth procedure (SS-4), the bits in the first and the second input vectors $V_1$ and $V_2$ in an input-vector pair other than the first and the second essential bits $B_1$ and $B_2$, respectively, are identified as the don't-care-bits. And in the determination procedure (S-2), the first and the second input vectors $V_1$ and $V_2$ in an input-vector pair, for the selected path $P_i$, from which the don't-care-bits are identified, are saved as don't-care-bits identified input vectors (S-4). For each of the rest of the paths, too, the don't-care-bits in the first and the second input vectors $V_1$ and $V_2$ in an input-vector pair are identified until the don't-care-bits are identified in the first and the second input vectors $V_1$ and $V_2$ in an input-vector pair for all the paths.

Then, the first and the second input vectors in an input-vector pair including the don't-care-bits exist for each of paths $P_i$, because, in the first and the second input vectors $V_1$ and $V_2$ in an input-vector pair obtained above, don't-care-bits are identified for each of the paths $P_i$. And a pair of the first (second) input vectors $V_1$s ($V_2$s) can be merged into one vector based on the following rules. That is, a pair of corresponding don't-care-bits in a pair of the first (second) input vectors $V_1$s ($V_2$s) including the first (second) don't-care-bits can be merged into the first (second) don't-care-bits $X_1$s ($X_2$s). As well, a pair of corresponding the first (second) don't-care-bit and a logic value 0 can be merged into logic value 0. And a pair of corresponding the first (second) don't-care-bit and a logic value 1 can be merged into logic value 1.

Although the present invention has been described above, referring to the preferred embodiment, the present invention is not restricted to the described configuration at all. The present invention includes other preferred embodiments or variants within the scope of the matters described in the claims.

For example, the don't-care-bits can be identified in the first and the second input vectors in an input-vector pair while keeping the sensitization status of only a part of the paths, in a combinational circuit, sensitized by applying the first and the second input vectors in an input-vector pair. Here, the part of the paths can be, for example, the longest path, among the paths established in the combinational circuit, established with the most logic elements. Or the part of the paths whose sensitization are kept can be, for another example, a plurality of paths ranking in the top of the predetermined number when the paths established in the combinational circuit are listed in order of the number of logic elements included in the paths with the most one first. Here, the predetermined number is, for example, in the top 60%, preferably in the top 50%, or further preferably in the top 30%, including the path with the most logic elements.

The don't-care-bit identification method and the don't-care-bit identification program in accordance with the present invention enables to preserve detecting capability of the first and the second vectors to test the combinational circuit, because don't-care-bits are identified from each of the first and the second input vectors in an input-vector pair, which are applied in serial to input line of combinational circuit, guaranteeing the path, in the combinational circuit, sensitized by the first and the second input vectors in an input-vector pair. Thereby, for example, test malfunction of semiconductor large scale integrated circuit and the number of products evaluated as defective can be decreased.

The invention claimed is:

1. A don't-care-bit identification method for identifying don't-care-bits from first and second input vectors in an input-vector pair, which are composed of bits comprising logic values 0 and 1, and which are applied to input lines of a combinational circuit or a combinational portion of a scan-designed sequential circuit, comprising:
   identifying the don't-care-bits from bits which cannot structurally reach any path sensitized by the first and second input vectors.

2. The don't-care-bit identification method according to claim 1,
   wherein the identifying the don't-care-bits from the bits comprises:
   a first step of specifying second input lines, in the combinational circuit or the combinational portion corresponding to the second input vector, which can be reached by tracing back from end-point output lines of a part of or all of the sensitized paths toward input side based on circuit information of the combinational circuit or the combinational portion;
   a second step of specifying first input lines, in the combinational circuit or the combinational portion corresponding to the first input vector, which can be reached by tracing back from the end-point output lines of a part of or all of the sensitized paths or from the second input lines toward input side based on circuit information of the combinational circuit or the combinational portion;

a third step of identifying logic bits, in the first and the second input vectors, corresponding to the first input lines or the second input lines, respectively, as first and second essential bits, respectively; and a fourth step of identifying bits in the first and the second input vectors other than the first and the second essential bits, respectively, as the don't-care-bits.

3. A non-transitory computer-readable medium storing a don't-care-bit identification computer program for identifying don't-care-bits from first and second input vectors in an input-vector pair, which are composed of bits comprising logic values 0 and 1, and which are applied to input lines of a combinational circuit or a combinational portion of a scan-designed sequential circuit, the computer program causing a computer to execute:

identifying the don't-care-bits from bits which cannot structurally reach any path sensitized by the first and second input vectors.

4. The non-transitory computer-readable medium storing the don't-care-bit identification computer program according to claim 3, wherein the identifying the don't-care-bits from the bits comprises:

a first procedure of specifying second input lines, in the combinational circuit or the combinational portion corresponding to the second input vector, which can be reached by tracing back from end-point output lines of a part of or all of the sensitized paths toward input side based on circuit information of the combinational circuit or the combinational portion;

a second procedure of specifying first input lines, in the combinational circuit or the combinational portion corresponding to the first input vector, which can be reached by tracing back from the end-point output lines of a part of or all of the sensitized paths or from the second input lines toward input side based on circuit information of the combinational circuit or the combinational portion;

a third procedure of identifying logic bits, in the first and the second input vectors, corresponding to the first input lines or the second input lines, respectively, as first and second essential bits, respectively; and a fourth procedure of identifying bits in the first and the second input vectors other than the first and the second essential bits, respectively, as the don't-care-bits.

5. A don't-care-bit identification method for identifying don't-care-bits from first and second input vectors in an input-vector pair, which are composed of bits comprising logic values 0 and 1, and which are applied to input lines of a combinational circuit or a combinational portion of a scan-designed sequential circuit, comprising:

while a part of or all of paths of the combinational circuit or the combinational portion are sensitized by applying sequentially the first and the second input vectors to the combinational circuit or the combinational portion, identifying don't-care-bits from bits of the first and second input vectors, the bits being independent of transitions in a part of or all of logic values of the sensitized paths when any logic values are assigned to the bits of the first and second input vectors.

6. The don't-care-bit identification method according to claim 5, wherein the identifying the don't-care-bits from the bits of the first and second input vectors comprises:

a first step of specifying second input lines, in the combinational circuit or the combinational portion corresponding to the second input vector, which can be reached by tracing back from end-point output lines of a part of or all of the sensitized paths toward input side based on circuit information of the combinational circuit or the combinational portion;

a second step of specifying first input lines, in the combinational circuit or the combinational portion corresponding to the first input vector, which can be reached by tracing back from the end-point output lines of a part of or all of the sensitized paths or from the second input lines toward input side based on circuit information of the combinational circuit or the combinational portion;

a third step of identifying logic bits, in the first and the second input vectors, corresponding to the first input lines or the second input lines, respectively, as first and second essential bits, respectively; and a fourth step of identifying bits in the first and the second input vectors other than the first and the second essential bits, respectively, as the don't-care-bits.

* * * * *